United States Patent
Hwang

(10) Patent No.: US 10,756,411 B2
(45) Date of Patent: Aug. 25, 2020

(54) HEAT RADIATING SHEET AND A WIRELESS POWER TRANSMISSION MODULE INCLUDING SAME

(71) Applicant: Amogreentech Co., Ltd., Gimpo-si (KR)

(72) Inventor: Seung Jae Hwang, Incheon (KR)

(73) Assignee: Amogreentech Co., Ltd., Gimpo-si (KR)

( * ) Notice: Subject to any disclaimer, the term of this patent is extended or adjusted under 35 U.S.C. 154(b) by 210 days.

(21) Appl. No.: 15/739,377

(22) PCT Filed: Jul. 4, 2016

(86) PCT No.: PCT/KR2016/007164
§ 371 (c)(1),
(2) Date: Dec. 22, 2017

(87) PCT Pub. No.: WO2017/007196
PCT Pub. Date: Jan. 12, 2017

(65) Prior Publication Data
US 2018/0198186 A1    Jul. 12, 2018

(30) Foreign Application Priority Data
Jul. 7, 2015  (KR) .................. 10-2015-0096620

(51) Int. Cl.
*H01Q 1/02* (2006.01)
*H01F 27/36* (2006.01)
(Continued)

(52) U.S. Cl.
CPC ............... *H01Q 1/02* (2013.01); *H01F 27/22* (2013.01); *H01F 27/36* (2013.01); *H01F 38/14* (2013.01);
(Continued)

(58) Field of Classification Search
CPC .................................. H01Q 1/02; H01Q 1/36
(Continued)

(56) References Cited

U.S. PATENT DOCUMENTS

| | | |
|---|---|---|
| 9,251,950 B2 | 2/2016 | Hatanaka et al. |
| 9,774,080 B2 | 9/2017 | Baek et al. |

(Continued)

FOREIGN PATENT DOCUMENTS

| | | |
|---|---|---|
| JP | 2014-011852 A | 1/2014 |
| KR | 10-2014-0010977 A | 1/2014 |

(Continued)

OTHER PUBLICATIONS

International Search Report dated Sep. 19, 2016; for Korean PCT Application: PCT/KR2016/007164; 4 pages.

*Primary Examiner* — Andrea Lindgren Baltzell
(74) *Attorney, Agent, or Firm* — Daly Crowley Mofford & Durkee, LLP

(57) ABSTRACT

Disclosed are a heat radiating sheet and a wireless power transmitting module including the same. A heat radiating sheet according to an exemplary embodiment of the present invention includes a plate-shaped heat radiating member having a predetermined area for radiating a heat generated from a heat source and a metallic protecting member, attached to a surface of the heat radiating member via an adhesive layer for protecting the heat radiating member in addition to for serving as an auxiliary heat radiating member.

7 Claims, 14 Drawing Sheets

(51) Int. Cl.
  *H04B 5/00* (2006.01)
  *H02J 50/23* (2016.01)
  *H01F 27/22* (2006.01)
  *H02J 50/40* (2016.01)
  *H01F 38/14* (2006.01)
  *H04B 7/08* (2006.01)
  *H02J 7/02* (2016.01)
  *H05K 7/20* (2006.01)
  *H01Q 1/36* (2006.01)
  *H02J 50/10* (2016.01)

(52) U.S. Cl.
  CPC .............. *H01Q 1/36* (2013.01); *H02J 7/02* (2013.01); *H02J 50/23* (2016.02); *H02J 50/40* (2016.02); *H04B 5/0037* (2013.01); *H04B 5/0056* (2013.01); *H04B 5/0075* (2013.01); *H04B 7/0848* (2013.01); *H05K 7/20* (2013.01); *H02J 7/025* (2013.01); *H02J 50/10* (2016.02)

(58) Field of Classification Search
  USPC ........................................................ 343/872
  See application file for complete search history.

(56) References Cited

U.S. PATENT DOCUMENTS

| | | | |
|---|---|---|---|
| 9,812,774 | B2 | 11/2017 | Jang et al. |
| 2009/0284436 | A1* | 11/2009 | McCarthy ............... H01Q 1/02 343/872 |
| 2015/0326056 | A1* | 11/2015 | Koyanagi ............... H02J 7/025 320/108 |

FOREIGN PATENT DOCUMENTS

| | | |
|---|---|---|
| KR | 10-2014-0048811 A | 4/2014 |
| KR | 10-2015-0024713 A | 3/2015 |
| KR | 10-2015-0050541 A | 5/2015 |

* cited by examiner

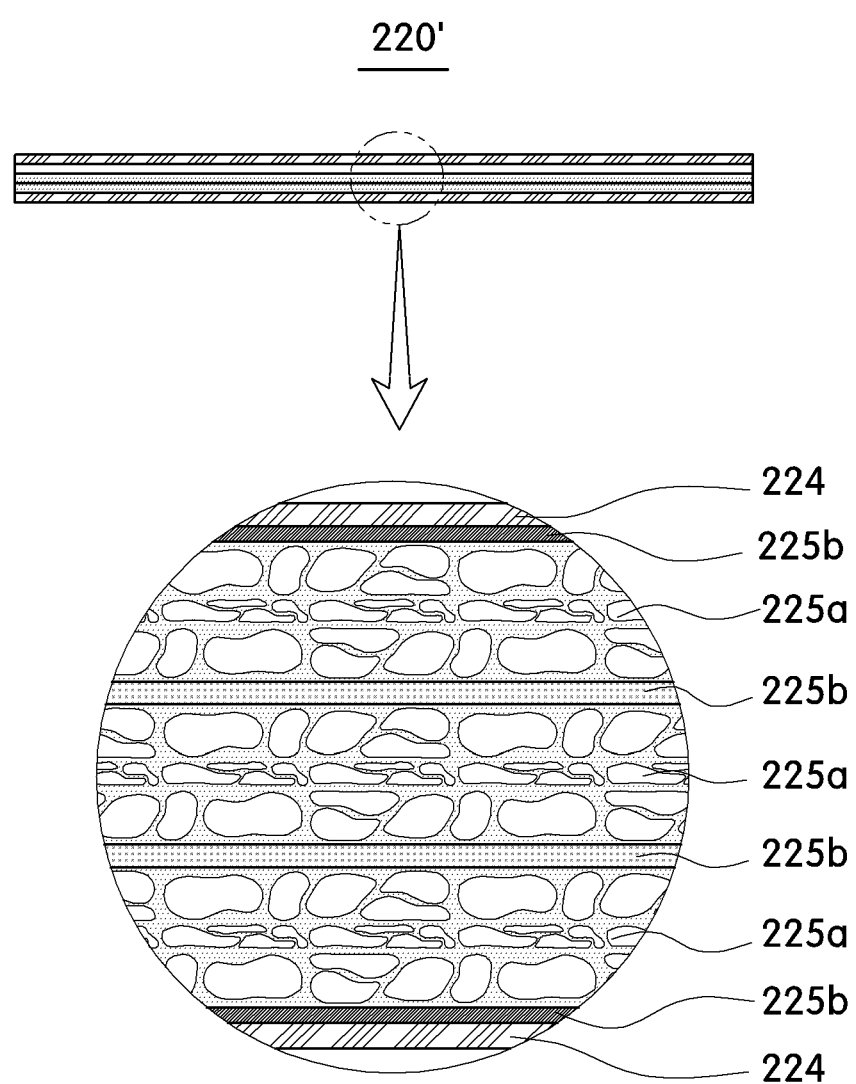

HEAT RADIATING SHEET AND A WIRELESS POWER TRANSMISSION MODULE INCLUDING SAME

CROSS-REFERENCE TO RELATED APPLICATION

This application is a U.S. National Stage of PCT/KR2016/007164 filed in the Korean language on Jul. 4, 2016, entitled: "Heat Radiating Sheet And A Wireless Power Transmission Module Including Same" which application claims priority to Korean Application No. 10-2015-0096620 filed on Jul. 7, 2015, which applications are each hereby incorporated herein by reference in their entireties.

BACKGROUND

1. Technical Field

The present invention relates to a heat radiating sheet, and more particularly to a heat radiating sheet capable of effectively radiating a heat generated from a heat source, and a wireless power transmitting module including the same.

2. Discussion of the Related Art

Generally, when an electronic product such as a computer, a display, or a portable terminal cannot appropriately radiate a generated heat to an outside, heat may be excessively accumulated, which may cause several problems such as afterimage on a screen or system failure, as well as a shortened lifetime of the product In recent years, the electronic product including the portable terminal has been advanced in terms of performance and multifunction, according to needs of users.

Particularly, in order to maximize portability and convenience of the user, the portable terminal has been required to be downsized and lightweight. For high performance of the portable terminal, integrated components are mounted in a further limited space. The components with high performance used in the portable terminal generate much more heat so that the temperature inside of the portable terminal increases. In the result, the increased temperature affects neighboring components, thereby deteriorating the overall performance of the portable terminal.

For example, recently the portable terminal has introduced a wireless charging function for wirelessly charging a built-in battery. The wireless charging can be performed by a wireless power receiving module built in the portable terminal and a wireless power transmitting module for supplying power to the wireless power receiving module.

The wireless power transmitting module and the wireless power receiving module are provided with a heat radiating sheet for radiating the heat generated during wireless charging, to the outside to increase charging efficiency. For example, a graphite having good thermal conductivity is usually used for the heat radiating sheet.

A protective film may be attached to the heat radiating sheet to protect the heat radiating sheet and prevent the heat radiating sheet from being exposed. As for the protective film, a fluorine resin film such as a polyethylene terephthalate (PET) film is generally used.

However, in case that a conventional protective film is made of the fluorine resin material such as PET, strength of the material is so weak that it may be scratched easily by external impact. Thus, the protective film cannot satisfactorily perform a function as a protective film for protecting a heat radiating member.

In addition, when the protective film is made of the fluorine resin material such as PET, there is a limitation in that the protective film performs only a simple protection function for protecting the heat radiating member, because its thermal conductivity is very low.

In recent years, the electronic device such as the portable terminal become thinner and smaller, and accordingly, components to be incorporated in the electronic device are also required to be thinner and smaller.

As an aspect of this, the components constituting the wireless power receiving module are made multifunctional. That is, by changing a material or a shape of a component having only one function, the component may have an additional function, in addition to its original function, for assisting its neighboring component in cooperation with other components. There is a demand for maintaining the same as or thinner thickness than that of a conventional product, while improving the characteristics.

SUMMARY

To solve the above problem and defects, it is an object of the present invention to provide a heat radiating sheet of which protective film to be attached to an exposed surface of a heat radiating member is replaced with a metallic material so that the heat radiating sheet can have an increased rigidity due to the metallic protective film itself and thus effectively prevent a damage by an external impact, thereby enhancing a protecting function against an external environment, and a wireless power transmitting module including the heating radiating sheet.

In addition, it is another object of present invention to provide a multifunctional heat radiating sheet which has a heat radiating function and a protective function by replacing a protective film of the heat radiating sheet to attached to a surface of the heat radiating member with a metallic thin film having thermal conductivity, and the wireless power transmitting module including the heat radiating sheet.

Further, it is another object of the present invention to provide a heat radiating sheet which can have an improved heat radiation performance while having the same thickness as or less than that of conventional protective film, by replacing a protective film of the heat radiating sheet attached to a surface of the heat radiating member with the metallic thin film having thermal conductivity, thereby improving the heat radiating performance without increasing the overall thickness of the heat radiating sheet, and the wireless power transmitting module including the heat radiating sheet.

To accomplish the above and other objects of the present invention, there is provided a heat radiating sheet that includes a plate-shaped heat radiating member having a predetermined area for radiating heat generated from a heat source; and a metallic protecting member, attached to a surface of the heat radiating member through an adhesive layer, for protecting the heat radiating member and in addition to for serving as an auxiliary heat radiating member.

According to a preferred embodiment of the present invention, the heat radiating member may be made of graphite, or a plate-shaped metallic member having a thermal conductivity of 200 W/m·K or more. Preferably, the plate-shaped metallic member may be made of copper, aluminum or the like.

In an embodiment of the present invention, the metallic protecting member may be a copper foil or a copper film.

In an embodiment of the present invention, the metallic protecting member may have a thickness of 1/5 to 1/3 of the thickness of the heat radiating member.

In an embodiment of the present invention, the metallic protecting member may include at least one slit having a predetermined length.

In an embodiment of the present invention, the slit may be formed on an area corresponding to a wireless power transmitting antenna disposed on one side of the heat radiating member.

In an embodiment of the present invention, the slit may be formed in a direction perpendicular to a longitudinal direction of a pattern constituting the wireless power transmitting antenna, or in a direction perpendicular to a tangent of a pattern constituting the wireless power transmitting antenna.

In an embodiment of the present invention, the adhesive layer may include a thermal conductive component.

According to a preferred another embodiment of the present invention, the metallic protecting member may include a substrate layer made of a metallic material and a coating layer which is radiation-coated on at least one side of the substrate layer In an embodiment of the present invention, the coating layer may include at least one selected from ceramics and metal oxides.

According to an aspect of the present invention, there is provided a wireless power transmitting module that includes an antenna unit including at least one wireless power transmitting antenna, a shielding sheet, disposed on a surface of the antenna unit, for shielding a magnetic field; and a heat radiating sheet, disposed on a side of the shielding sheet, for radiating heat.

In an embodiment of the present invention, the antenna unit may be a combo type including at least one of an magnetic secure transfer (MST) antenna and a near field communication (NFC) antenna.

In an embodiment of the present invention, the shielding sheet may include any one of a ribbon sheet including at least one of an amorphous alloy and a nanocrystal alloy, a ferrite sheet, and a polymer sheet.

In an embodiment of the present invention the shielding sheet may include a plurality of sheets having different characteristics in a predetermined frequency band.

In an embodiment of the present invention, the plurality of sheets may include the ribbon sheet including at least one of the amorphous alloy and the nanocrystalline alloy, and the ferrite sheet.

In an embodiment of the present invention, the shielding sheet may be divided into a plurality of fine pieces, and the plurality of fine pieces may be entirely or partially insulated between neighboring fine pieces, and the plurality of fine pieces may have irregular shapes.

In an embodiment of the present invention, the wireless power transmitting module may be implemented by a wireless power receiving module in which the wireless power transmitting antenna serves as a power receiving antenna for receiving wireless power, or the wireless power transmitting antenna may be implemented by the wireless power transmitting module serving as a power transmitting antenna for transmitting wireless power.

According to the preferred embodiments of the present invention, the protective film to be attached to the heat radiating member is made from a metallic material that can enhance rigidity of the heat radiating member. As a result, the heat radiating sheet can prevent a damage caused by an external impact, thereby enhancing the protection function against the external environment.

In addition, according to the embodiments of the present invention, the heat radiating member can have an enhanced heat radiating performance by replacing the protective film attached to one surface of the heat radiating member with a metallic protecting member made from a metallic material having thermal conductivity, so as to add the heat radiating function in addition to the protecting function.

Further, according to the preferred embodiments of the present invention, the slit-like structure for suppressing eddy current loss and the coating layer for improving the radiation rate are applied to the metallic protecting member. Thus, the heat radiating efficiency can be improved and the wireless charging efficiency can be further increased.

BRIEF DESCRIPTION OF THE DRAWINGS

FIG. 12 is a view showing of another type of the shielding unit applicable to the wireless power transmitting module, according to an exemplary embodiment of the present invention.

DETAILED DESCRIPTION OF THE EMBODIMENTS

Figure 1:
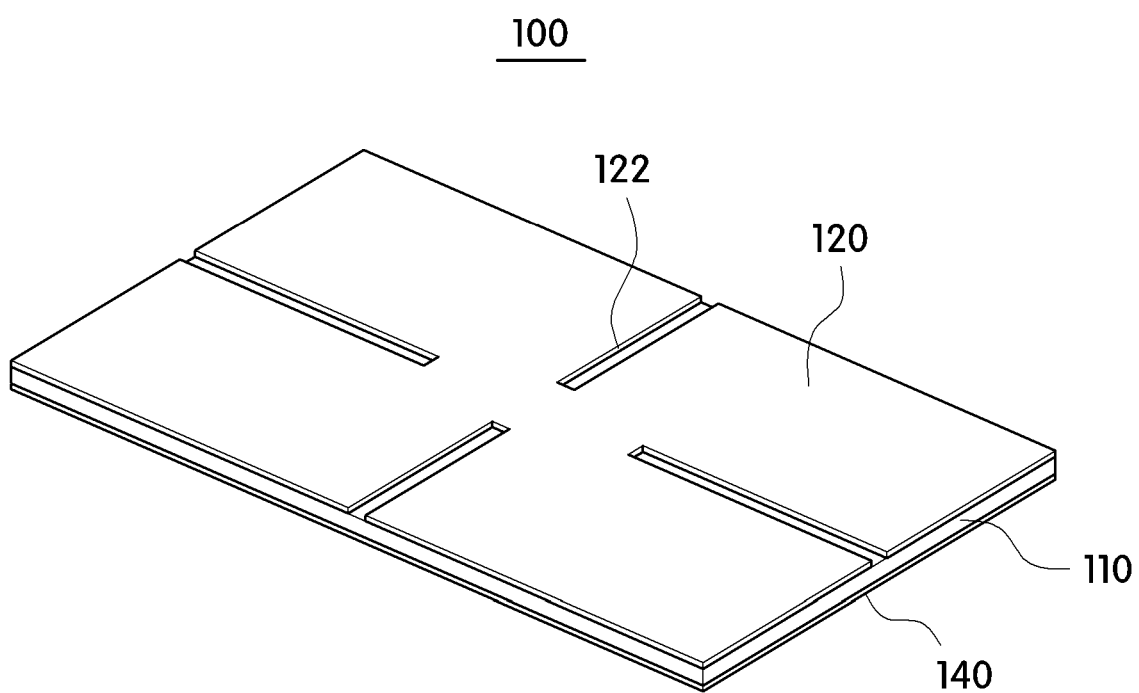
FIG. 1 is a view showing a heat radiating sheet, according to an exemplary embodiment of the present invention.

Hereinafter, exemplary embodiments of the present invention will be described in detail with reference to the accompanying drawings, which will be readily apparent to those skilled in the art to which the present invention pertains. The present invention may be embodied in many different forms and is not limited to the embodiments described herein. In the drawings, parts not relating to the description are omitted for clarifying the present invention, and the same reference numerals are assigned to the same or similar components throughout the specification.

Figure 2:
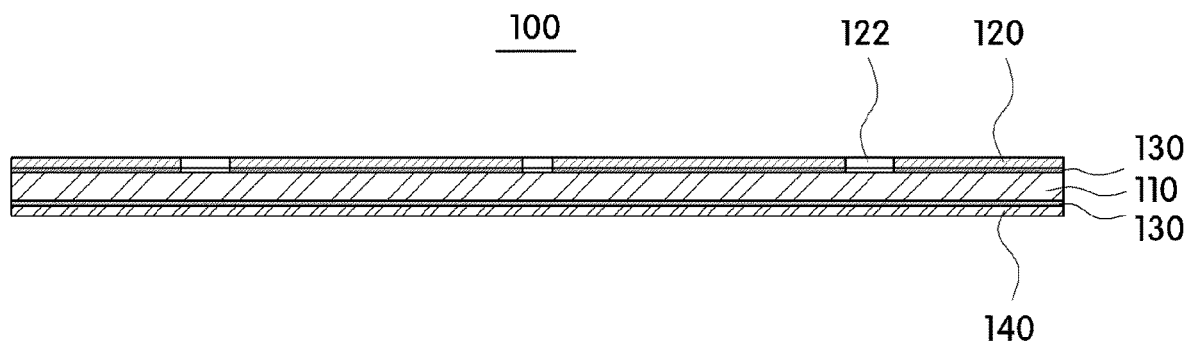
FIG. 2 is a sectional view of the heat radiating sheet shown in FIG. 1.
Figure 3A:
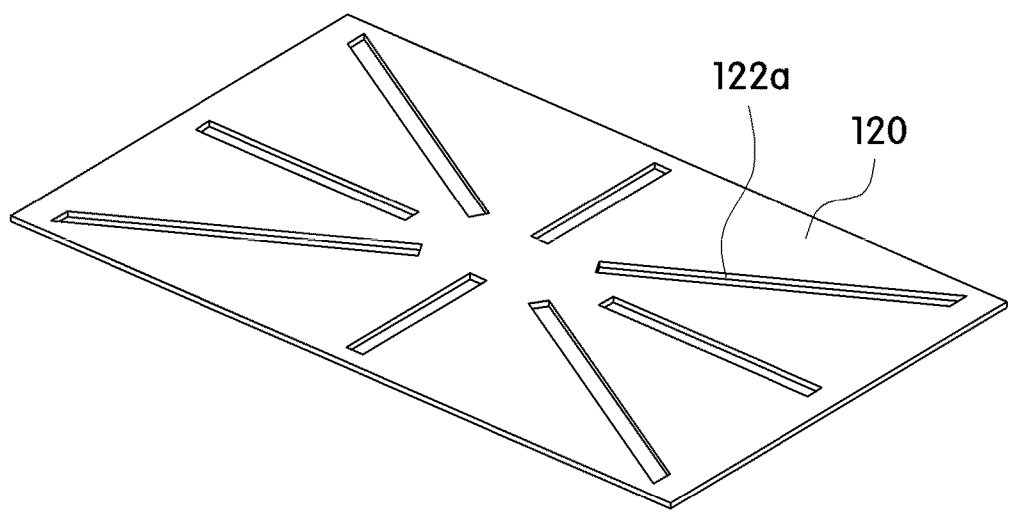
FIGS. 3A to 3D are views showing various form of slits in a metallic protecting member, according to exemplary embodiments of the present invention.
Figure 3B:
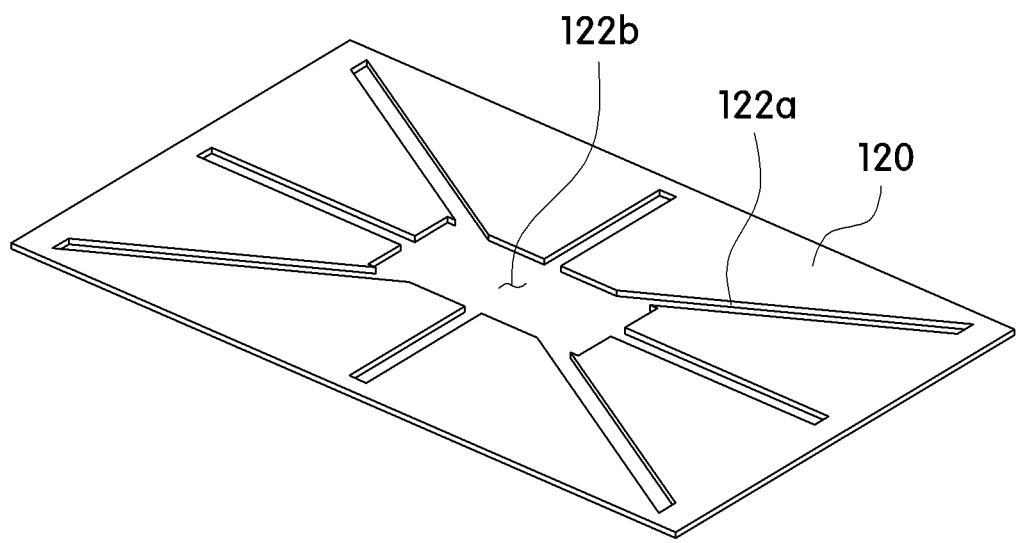
Figure 3C:
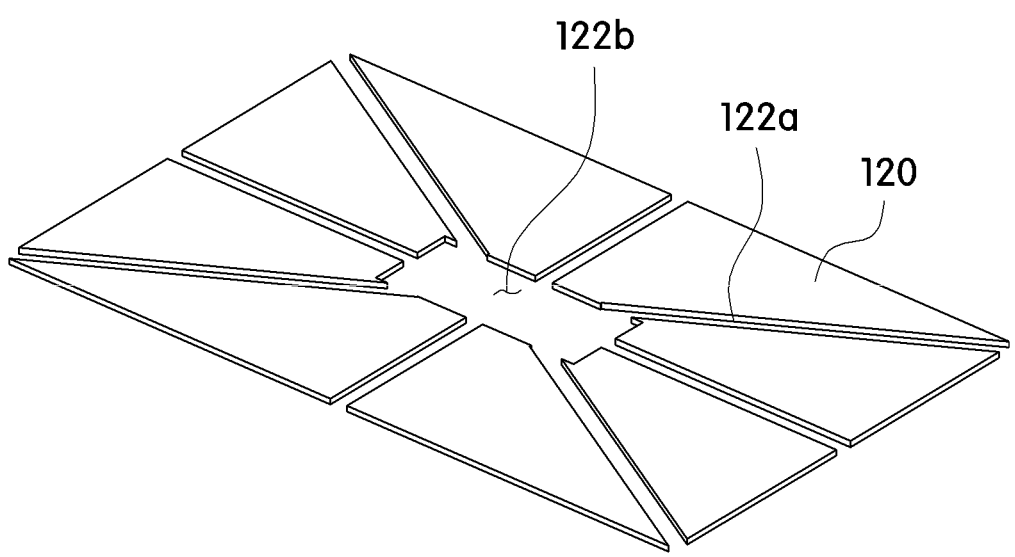
Figure 3D:
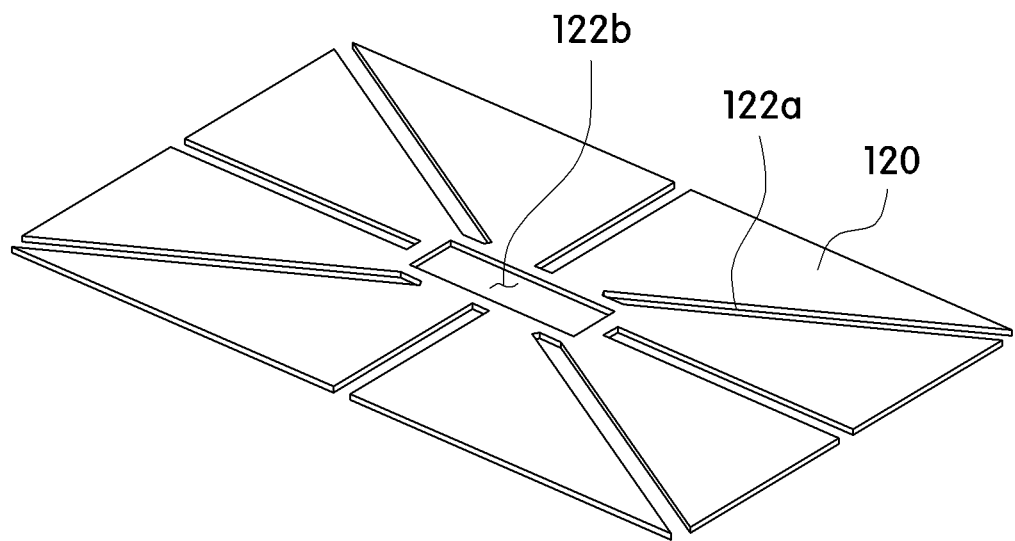

In an exemplary embodiment, a heat radiating sheet 100 may include a heat radiating member 110 and a metallic protecting member 120 as shown in FIGS. 1 and 2.

The heat radiating member 110 is for radiating a transferred heat from a heat source to outside. To this end, the heat radiating member 110 may be provided with a material having excellent thermal conductivity. In an exemplary example, the heat radiating member 110 may be made from any one of copper, aluminum, and graphite, or a combination of two or more of these materials. The heat radiating member 110 may be made from a metallic material having the thermal conductivity of 200 W/m·K or more.

In this case, the heat radiating member 110 may be a plate-shaped member having a predetermined area so as to widen a contact area with the heat source and to rapidly disperse and/or radiate the heat generated from the heat source.

The metallic protecting member 120 may be attached to a surface of the heat radiating member 110. In an exemplary embodiment, the metallic protecting member 120 may be made from a metallic material so that it can further have a function other than the function for protecting the heat radiating member 110. The metallic protecting member 120 is provided with relatively thin thickness compared to the heat radiating member 110.

The metallic protecting member 120 may be provided, in place of the conventional protecting film, to have substantially the same thickness as that of a conventional protecting film attached to at least a surface of the heat radiating member 110 to protect the heat radiating member 110.

Accordingly, unlike the conventional protective film simply protecting the heat radiating member 110 from the external environment, the metallic protecting member 120 can protect the heat radiating member 110 from the external environment as well as have an additional function to complement a heat radiating performance of the heat radiating member 110.

Here, the metallic material constituting the metallic protecting member 120 may be copper, aluminum or a combination thereof, which have excellent thermal conductivity, or may be an alloy including at least one of copper or aluminum. However, it should be noted that the metallic protecting member 120 is not limited to the above-mentioned metallic materials, and any thin metallic material can be used for the metallic protecting member 120.

For example, the metallic protecting member 120 may be provided in a form of thin-plate having a thin thickness such as a copper foil or a copper film. The copper foil may have a thickness of 1/5 to 1/3 of a thickness of the heat radiating member 110.

The metallic protecting member 120 made of the metallic material may be provided to have the same thickness as or less than that of the conventional protective film so as to replace the conventional protective film. As a result, the heat radiating sheet 100 can further have the heat radiating function in addition to the protecting function without increasing the overall thickness of the heat radiating sheet 100.

As a specific example, the heat radiating member 110 may have a thickness of 17 μm and the metallic protecting member 120 may have a thickness of 5 μm, so that the overall thickness of the heat radiating sheet 100 can be 40 μm or less.

However, it should be understood that the thickness of the heat radiating member 110 and the metallic protecting member 120 may not be limited thereto. They may have very thin thickness and may have various thicknesses according to design requirements.

Accordingly, the heat radiating sheet 100 according to the present invention may be enhanced in its overall heat radiating performance by complementing heat radiating performance through the metallic protecting member 120 without increasing the overall thickness.

In addition, since the metallic protecting member 120 is provided with the metallic material, rigidity of the material itself is increased, so that the rigidity of the protective film 120 may be significantly increased as compared with the conventional protective film made of the material such as PET. Accordingly, unlike the conventional protective film in which damage such as scratch is easily generated against an external impact, the radiating member 110 may be more stably protected from the external environment.

In addition, since the metallic protecting member 120 is provided with the metallic material, it may perform a function for blocking a noise such as Electro Magnetic Inference (EMI). In particular, in case that the metallic protecting member 120 is provided with the copper foil or the aluminum foil having a high electrical conductivity and a low resistance, electromagnetic waves generated from peripheral circuit components may be effectively blocked.

For example, when the heat radiating sheet 100 according to the present invention is applied to the wireless power transmitting module 200 or 300 including an wireless power transmitting antenna and a shielding sheet 220 as shown in FIGS. 6 to 10, especially when the heat radiating sheet 100 is applied to a wireless power receiving module 200 which is a type of the wireless power transmitting module, the heat generated in the heat source may be more effectively radiated without increasing the thickness of the wireless power receiving module 200, and may be increased the wireless charging efficiency.

In addition, even when the heat radiating sheet 100 according to the present invention is disposed on the back surface of a display panel included in the portable terminal, the generated heat may effectively be radiated while having the same thickness as or less than that of the conventional heat radiating sheet.

The metallic protecting member 120 may be attached to one surface of the heat radiating member 110 through an adhesive layer 130. Here, on the other surface of the heat radiating member 110 may be attached by a protective film 140 provided with a fluororesin-based film including at least one of a polyethylene terephthalate (PET), a polypropylene (PP), and a polyterephthalate (PTFE), for the purpose of protecting the heat radiating member 110.

When the heat radiating sheet 100 is attached to a predetermined adhesive surface (for example, the shielding sheet 220 or a fixed frame (not shown) or the like), by removing the protective film 140, the heat radiating sheet may be attached to the adhesive surface via an adhesive layer 130 disposed between the protective film 140 and the heat radiating member 110 without using a separate adhesive means.

On the other hand, the adhesive layer 130 is provided to have thermal conductivity to further enhance the heat radiating efficiency. The adhesive layer 130 may be provided with an adhesive agent including a thermal conductive component, or may be provided by applying an adhesive agent including the thermal conductive component on a substrate of the plate and on at least one side of the substrate. Here, the meaning of the adhesion includes both the concepts of cohesion and bonding.

For example, the adhesive agent may be any one selected from a group of acrylic, urethane and silicone adhesive agent. According to an exemplary embodiment, the adhesive agent may be a thermal conductive adhesive agent including a thermal conductive filler for a heat radiation property. There is no limitation in the kind of the thermal conductive filler included in the adhesive agent as long as it has a thermal conductivity. That is, the thermal conductive filler may include a metallic material, an inorganic material, an organic material, or any combination thereof. Specifically, the thermal conductive filler may include at least one material selected from the group consisting of a metal powder such as aluminum (Al), nickel (Ni), copper (Cu), tin (Sn), zinc (Zn), tungsten (W), iron (Fe), silver (Ag), gold (Au), and the like; calcium carbonate ($CaCO_3$), aluminum oxide ($Al_2O_3$), aluminum hydroxide ($Al(OH)_3$), silicon carbide (SiC); an inorganic powder such as boron nitride (BN) and aluminum nitride (AlN); and as for carbon material, an organic powder such as graphite, graphene, carbon nanotubes (CNT), carbon nanofibers (CNF) and the like. The thermal conductive filler may preferably include at least one carbon material selected from the group consisting of graphite, graphene, CNT, and CNF. In addition, the thermal conductive filler may be mixed with the adhesive agent in an appropriate amount within a range not lowering the adhesive strength. For example, 0.5 to 500 parts by weight of the thermal conductive filler may be mixed with 100 parts by weight of the adhesive agent. When the content of the thermal conductive filler is less than 0.5 parts by weight, the thermal conductivity may be insufficient depending on the content thereof. When the content of the thermal conductive filler is larger than 500 parts by weight, the content of the adhesive agent may be relatively decreased and the adhesive strength may be weakened. In addition, the thermal conductive adhesive agent may further include a dispersing agent for uniform dispersion of the thermal conductive filler, a crosslinking agent for controlling the adhesive property, and the like. In addition, the thermal conductive adhesive agent may further optionally include an antioxidant, an antifoaming agent, a viscosity agent, a flame retardant, and the like in a range that does not adversely affect the adhesive strength.

Figure 5:
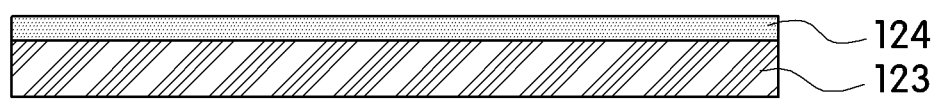
FIG. 5 is a view showing a sectional view of the metallic protecting member laminated with a coating layer, according to an exemplary embodiment of the present invention.

As shown in FIG. 5, the metallic protective member 120' may include a substrate layer 123 made of the metallic material for radiating and a coating layer 124 spin-coated on at least one surface of the substrate layer 123. Here, the coating layer 124 is provided with a metallic oxide material including ceramic or carbon black having a nano-sized particle. The coating layer 124 may be increased an radiating rate, so that the heat radiating effect of the metallic protecting member 120' may be further enhanced.

In addition, the metallic protecting member 120 may form an oxide film by oxidizing the surface of the metallic material constituting the metallic protecting member 120 through the blackening treatment. For example, in case that the metallic material is copper, the oxide film may be a material such as CuO or $Cu_2O$.

By this process, it is possible to minimize a cracking by preventing corrosion and to improve the adhesion according to the increase of the surface area and to increase the radiating rate of the material itself, thereby enhancing the heat radiating property without increasing the overall thickness.

In addition, the oxide film formed on the surface of the metal layer may act as an insulating layer, thereby increasing the overall resistance value, and thereby reducing the occurrence of eddy currents. Here, the blackening treatment may be performed using chemicals, heat treatment, or plasma treatment.

Meanwhile, the metallic protecting member 120 according to the present invention may include at least one slit 122 having a predetermined length to increase the self-resistance of the metallic protecting member 120, thereby suppressing the generation of eddy current.

Particularly, in case that the heat radiating sheet 100 is applied to the wireless power transmitting module 200 or 300 including at least one wireless power transmitting antenna 211, it is possible to increase the wireless charging efficiency by suppressing the generation of the eddy current through the slit 122 formed in the metallic protecting member 120.

Here, the slit 122 may be entirely or partially provided in the metallic protecting member 120. When a plurality of slits are provided, the plurality of slits 122 are arranged in a predetermined pattern, or may be arranged in a random pattern.

In other words, the slit 122 may be formed in various forms because it may suppress the generation of eddy current even if at least one of the slits 122 is formed at an arbitrary position of the metallic protecting member 120. The slit may be formed concentrically with respect to a local area of the entire area of the metallic protecting member 120.

For example, the slit 122 may be formed in various forms as shown in FIGS. 3A to 3D. Specifically, the slit 122 may be in the form of an incision portion 122a pass-through formed on inner of the metallic protecting member 120 with a predetermined length (refer to FIGS. 3A and 3B), and may be in the form of an incision portion 122a pass-through formed with a predetermined length inward from the rim of the metallic protecting member 120 (refer to FIGS. 3C and 3D). The slit may be in the form of a through-hole 122b formed on inner of the metallic protecting member 120 with a predetermined length (refer to FIGS. 3B to 3D). In addition, the incision portion 122a and the through-hole 122b may be connected to each other (refer to FIGS. 3B to 3D), or the incision portion 122a and the through-hole 122b may be not connected to each other. Although the slit 122 is illustrated as passing through the metallic protecting member 120, the present invention is not limited thereto, and may be provided as a receiving portion inserted with predetermined depth at a surface of the protecting member 120.

Here, the slit 122 may be formed to avoid a specific position. In an exemplary example, it may be formed by avoiding a region corresponding to a heat generating component which generates a lot of heat during operating such as an Application Processor (AP). In other words, since the slit 122 is not formed directly above or below the heat generating component, a hindrance of the radiating of heat transmitted from the heat generating component is prevented, the deteriorating or minimizing of the heat radiating performance is prevented.

In case that a heat radiating sheet 100 according to an exemplary embodiment of the present invention is applied to the wireless power transmitting module 200 or 300 including the wireless power transmitting antenna 211, and at least one slit 122 is formed in the metallic protecting member 120, the slit 122 may be formed in an area corresponding to the wireless power transmitting antenna 211, and may be formed in a direction perpendicular to the pattern constituting the wireless power transmitting antenna 211.

Figure 4A:
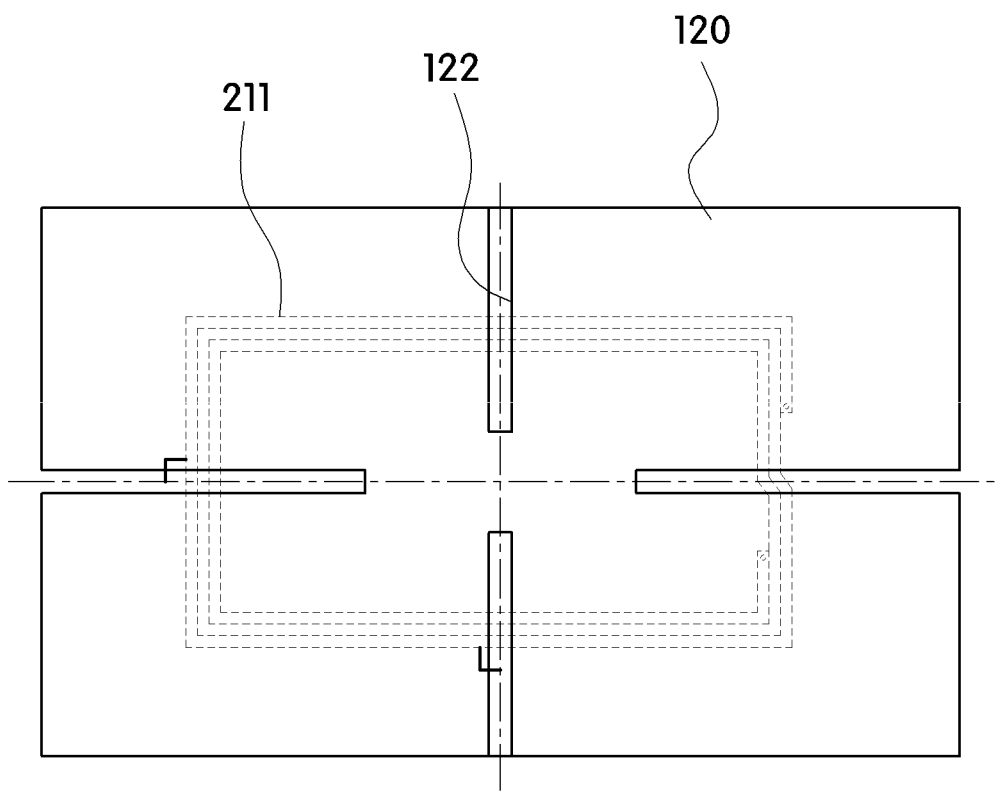
FIGS. 4A to 4D are schematic views showing an disposition between the slit of the metallic protecting member and a wireless power transmitting antenna, according to exemplary embodiments of the present invention.
Figure 4B:
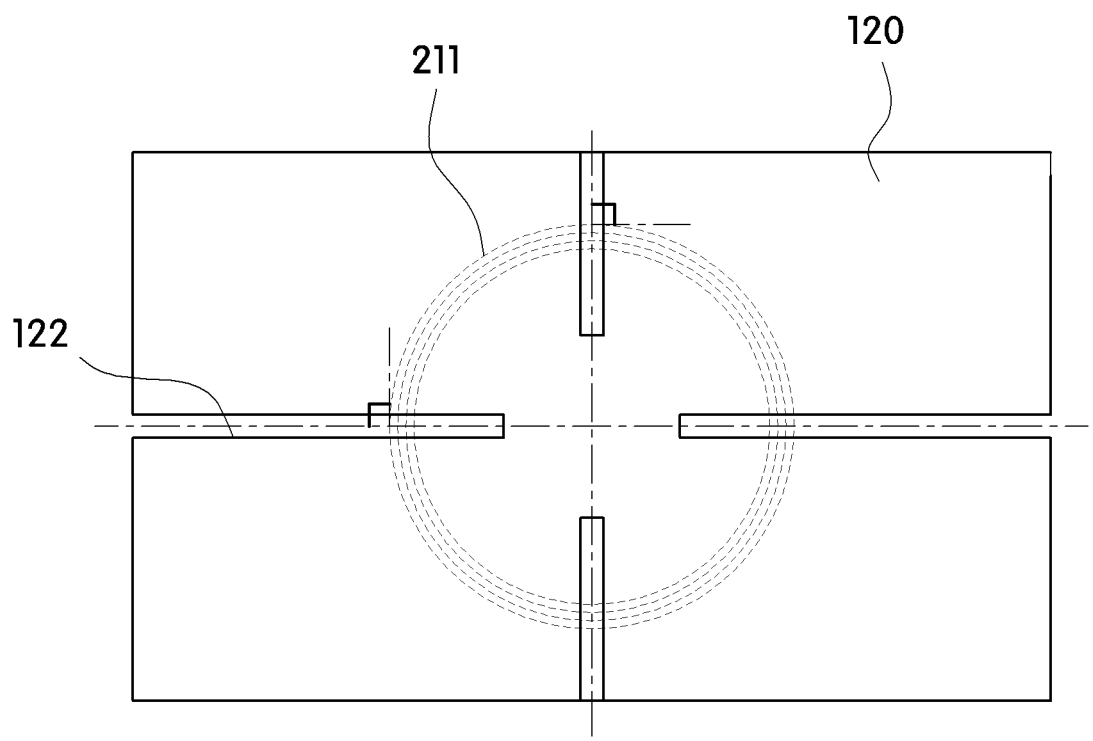
Figure 4C:
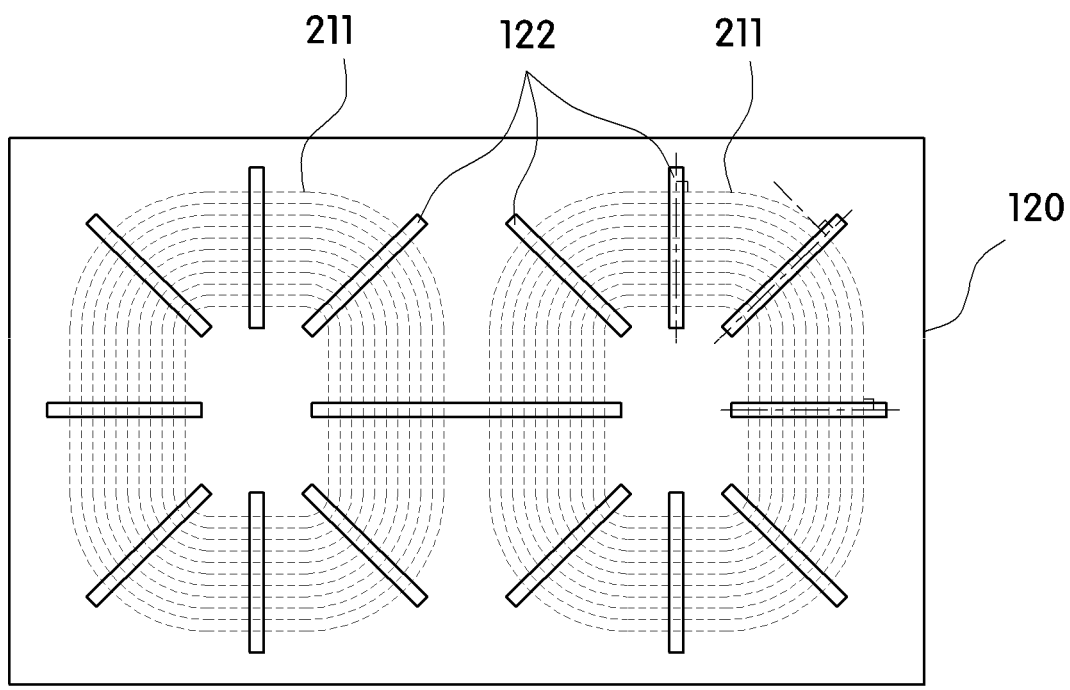

As shown FIGS. 4A and 4C, in case that the wireless power transmitting antenna 211 is formed in a rectangular pattern, the slit 122 may be provided so as to have a predetermined length in the direction perpendicular to the longitudinal direction of the pattern constituting the wireless power transmitting antenna 211.

Figure 4D:
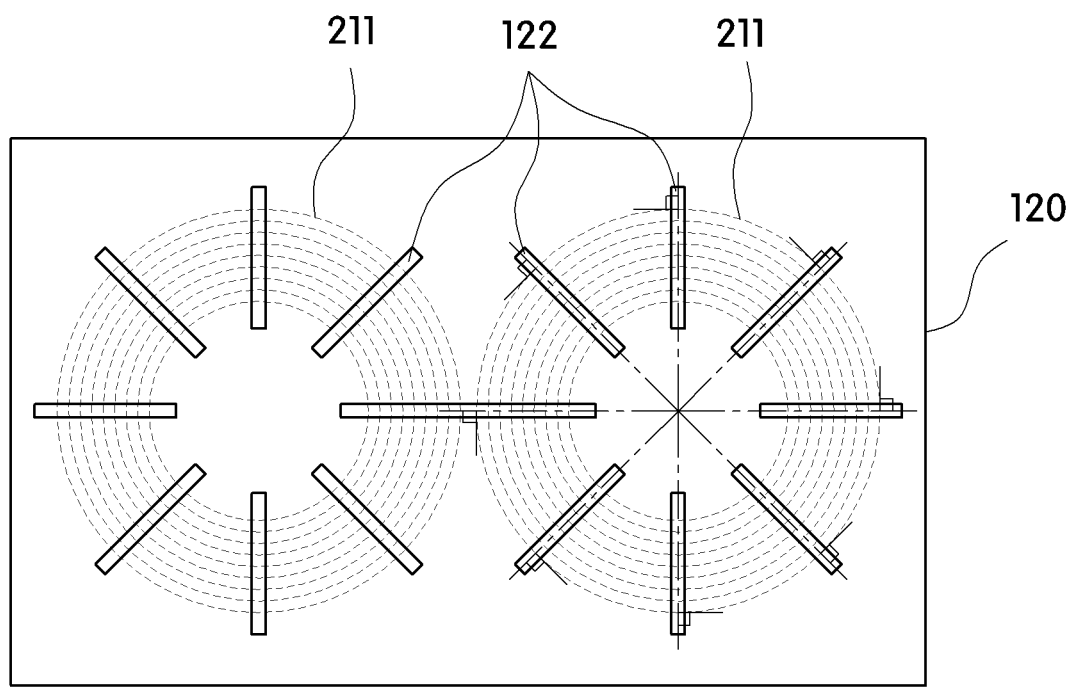

As shown in FIGS. 4B and 4D, in case that the wireless power transmitting antenna 211 is formed in a circular pattern, the slit 122 is may be provided so as to have a predetermined length in direction perpendicular to a tangent line of the pattern constituting the wireless power transmitting antenna 211.

In addition, as shown in FIGS. 4C and 4D, when a plurality of the wireless power transmitting antenna are provided, the slit 122 is formed at position corresponding to the respective wireless power transmitting antenna 211.

In addition, when the wireless power transmitting antenna 211 is provided in a form having both a straight section and a curved section, the slit formed in the straight section may be provided to have a predetermined length in direction perpendicular to longitudinal direction of the pattern constituting the wireless power transmitting antenna 211 and the slit formed in the curved section may be provided to have a predetermined length in direction perpendicular to the tangent line of the pattern constituting the wireless power transmitting antenna 211 (refer to FIG. 4C).

The heat radiating sheet 100 described above may be applied to various electronic devices requiring heat radiating, and may be applied to various components included in electronic devices. Here, the electronic device may be a portable electronic device such as a mobile phone, a PMP, a tablet PC, a notebook, or the like.

For example, the heat radiating sheet 100 may be applied to a rear surface of a display panel to radiate heat of the heat generating component including the display panel, or may be applied to the antenna module that performs various functions using a predetermined frequency band.

In particular, the heat radiating sheet 100 according to the present invention may be applied to the wireless power transmitting module 200 or 300 for charging a battery in wireless manner or for producing a required power in wireless manner.

As a specific example, the heat radiating sheet 100 may be applied to the wireless power transmitting module 200 or 300 including the antenna unit 210 or 310 and the shielding sheet 220 as shown in FIGS. 6 to 10.

In an exemplary embodiment of the present embodiment, the wireless power transmitting module 200 or 300 may be the wireless power receiving module 200 embedded in the electronic device such as the mobile phone, the PMP, the tablet PC, the notebook computer, and the like, and the wireless power transmitting module 300 or 300' for transmitting the wireless power signal to the receiving module side.

Here, the heat radiating sheet 100 may be disposed on one side of the shielding sheet 220 to radiate the generated heat to the outside during wireless charging, thereby increasing the charging efficiency of the wireless power transmitting modules 200 or 300. The area of the heat radiating sheet 100 may have substantially the same as the area of the shielding sheet 220, and may have substantially the same as the area of one surface of the shielding sheet 220. In addition, the area of the heat radiating sheet 100 may have a relatively smaller than the area of the shielding sheet 220 so as to the heat radiating sheet 100 may be partially provided on one surface of the shielding sheet 220, or a plurality of smaller heat radiating sheets may be provided on one surface of the shielding sheet 220 with a predetermined gap there between.

Since the heat radiating sheet 100 is the same as that described above, a detailed description thereof will be omitted.

The antenna unit 210 or 310 may include at least one antenna that performs a predetermined function by transmitting or receiving the wireless signal in a predetermined frequency band, and includes a wireless power transmitting antenna 211 for transmitting or receiving the wireless power.

Here, a radiator of the antenna may be formed of a flat coil wound in a clockwise direction or counterclockwise direction. The wound flat coil may have a circular shape, an elliptical shape, a spiral shape, or a polygonal shape such as a quadrangular shape. The antenna may be a loop-shaped coil pattern which can be made by patterning a conductor such as a copper foil on at least one surface of a circuit board 112 made of synthetic resin such as polyimide (PI), polyethylene terephthalate (PET), or the like, or by using conductive ink, or may be configured in a form of combination of the flat coil and the antenna pattern patterned on the circuit board.

In this case, the wireless power transmitting antenna 211 is for generating power using an inductive coupling method or a magnetic resonance method based on an electromagnetic induction phenomenon through the wireless power signal, and may be the wireless power receiving antenna to receive the wireless power signal, or may be the wireless power transmitting antenna to transmit the wireless power signal.

Figure 8:
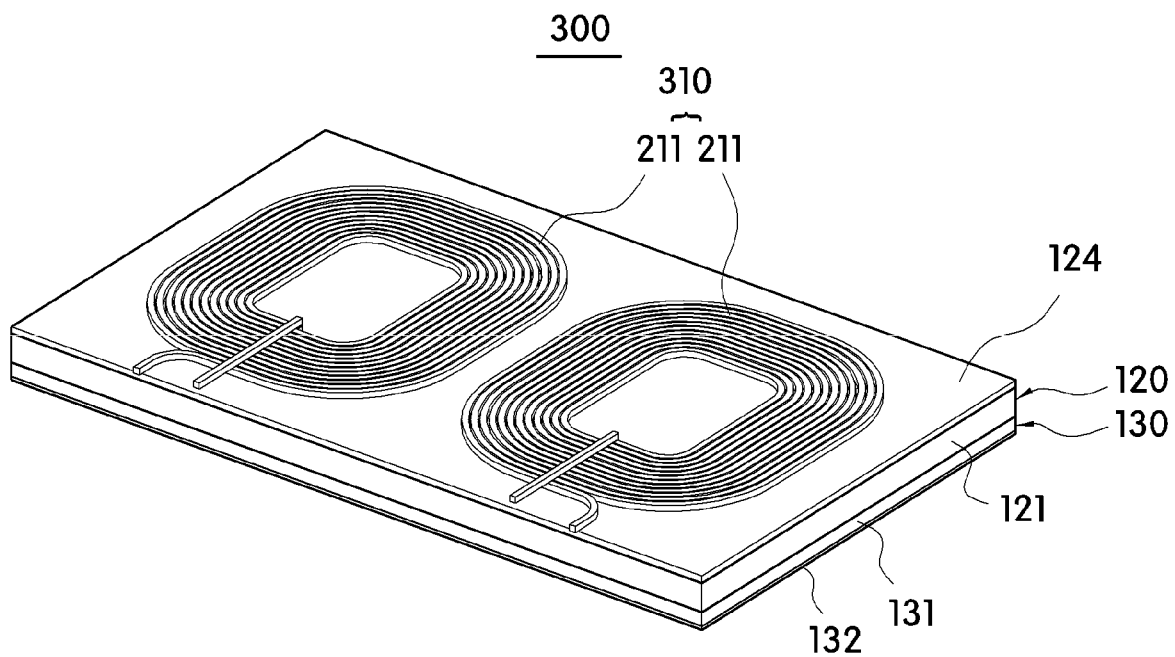
FIG. 8 is a schematic view of another type of the wireless power transmitting module to which the heat radiating sheet is applied, according to an exemplary embodiment of the present invention.
Figure 9:
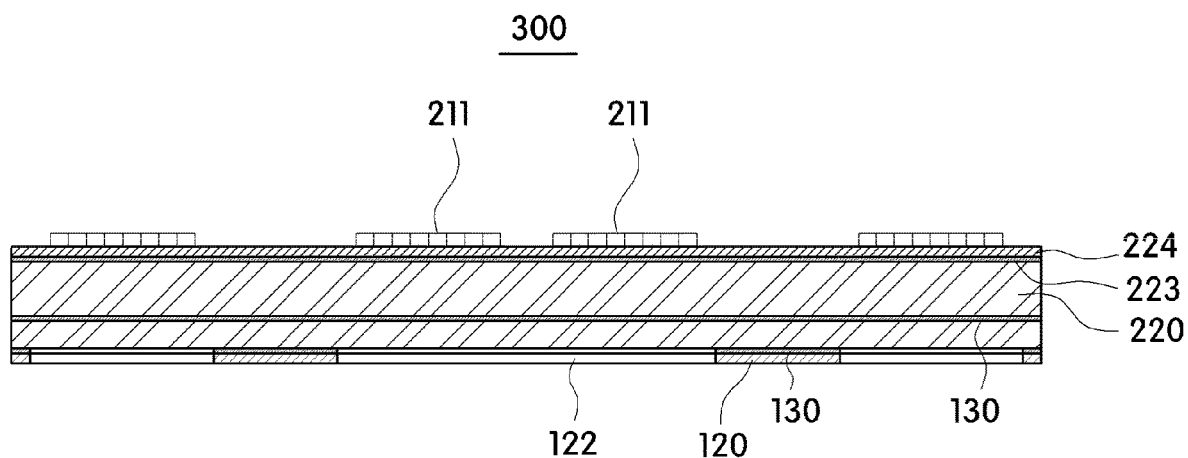
FIG. 9 is a sectional view of the wireless power transmitting module shown in FIG. 8.
Figure 10:
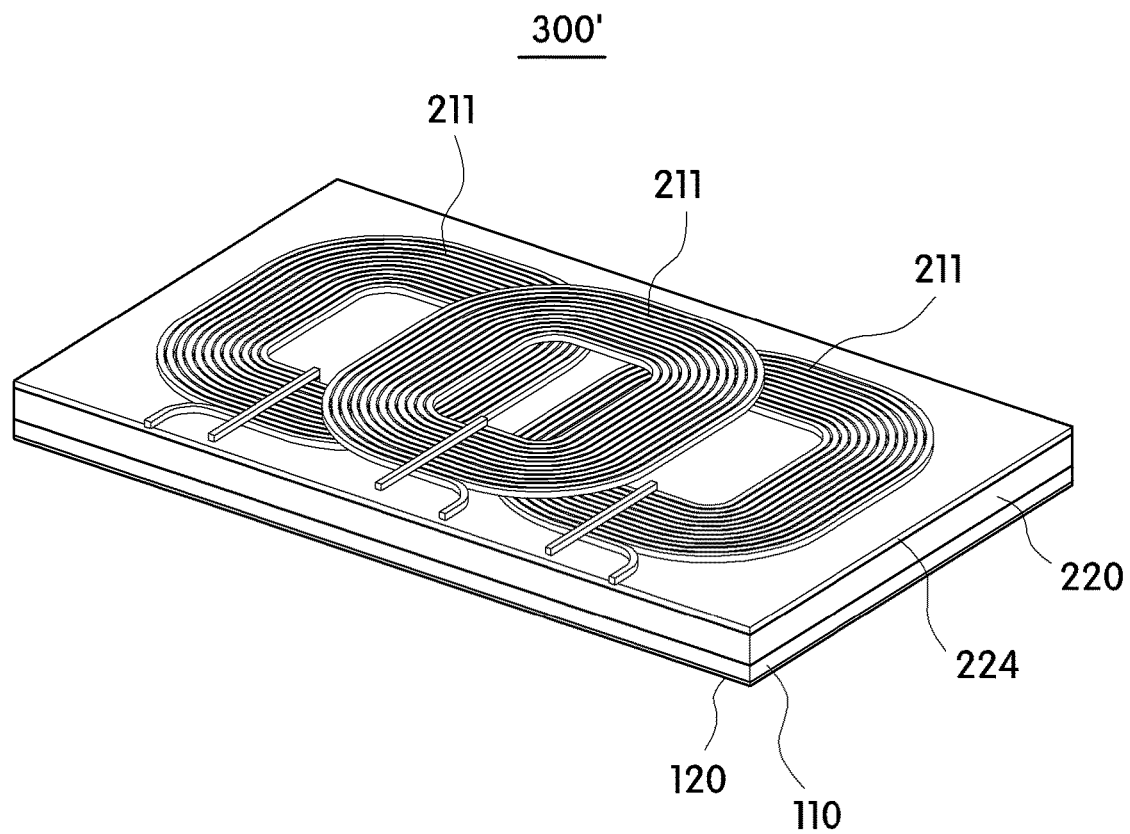
FIG. 10 is a schematic view of another type of the wireless power transmitting module to which the heat radiating sheet is applied, according to an exemplary embodiment of the present invention.

In addition, the wireless power transmitting antenna 211 may be provided with one (refer to FIG. 6) or with a plurality of ones (refer to FIGS. 8 and 10).

That is, when the wireless power transmitting antenna 211 performs a role of the receiving antenna, the wireless power transmitting module 200 or 300 may be implemented as the wireless power receiving module 200, and when the wireless power transmitting antenna 211 performs a role of the transmitting antenna, the wireless power transmitting module 200 or 300 may be implemented as the wireless power transmitting module 300 and 300'.

The antenna unit 210 may further include other antennas 212 and 213 that perform a different role from the wireless power transmitting antenna 211 for transmitting or receiving the wireless power.

Figure 6:
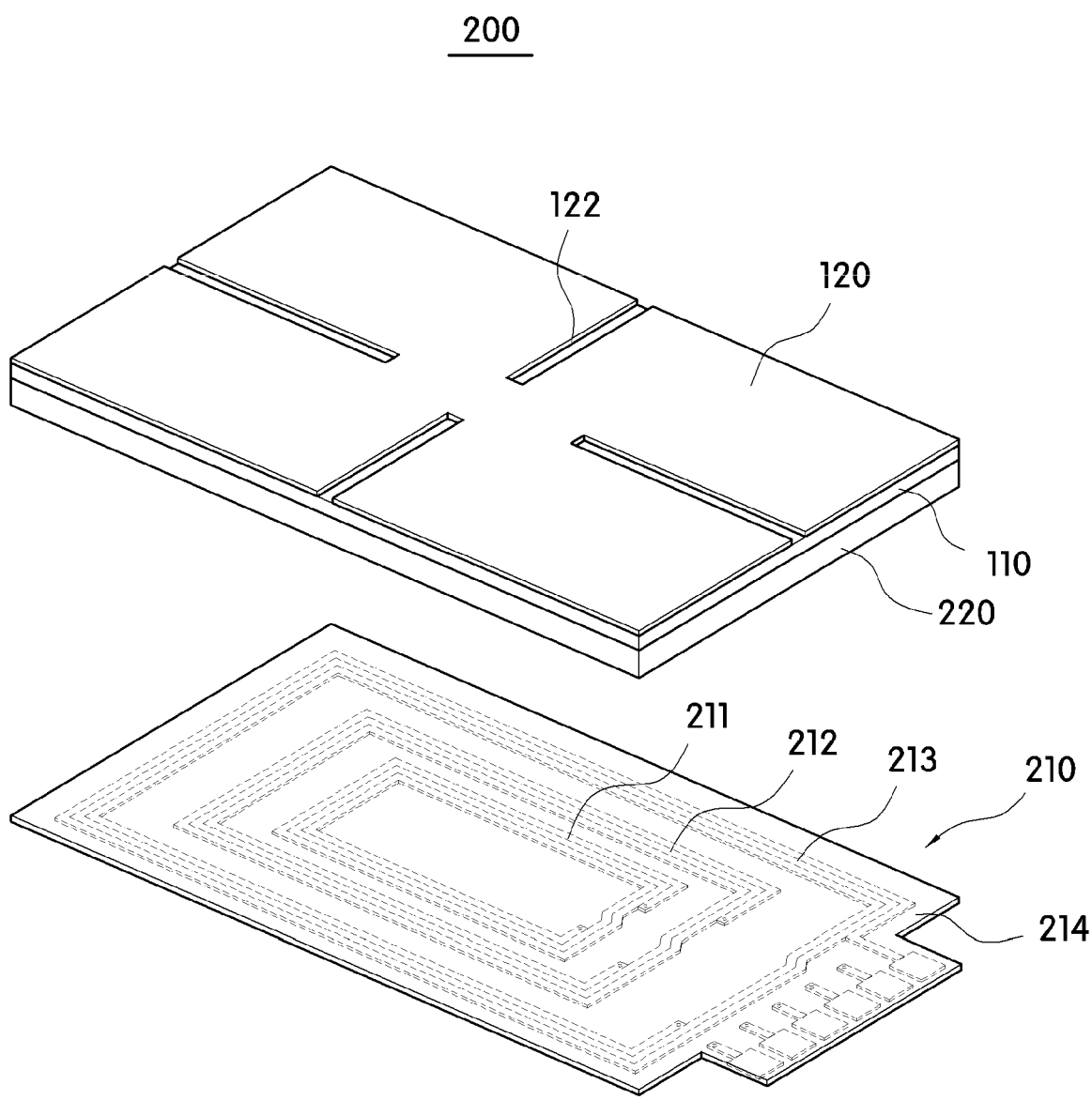
FIG. 6 is a schematic view of a wireless power transmitting module to which the heat radiating sheet is applied, according to an exemplary embodiment of the present invention.
Figure 7:
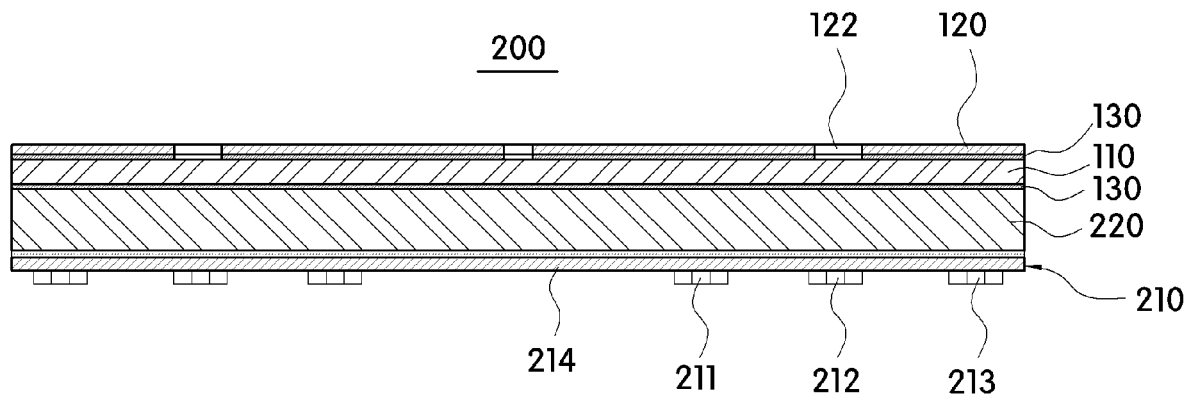
FIG. 7 is a sectional view of the wireless power transmitting module shown in FIG. 6.

For example, the antenna unit 210 includes a combo type including at least one of an MST 212 antenna and an NFC antenna 213 using a different frequency band from the wireless power transmitting antenna 211 (refer to FIG. 6).

In addition, it is noted that the antenna unit 210 or 310 may perform the role of another antenna such as the MST antenna or the NFC antenna through a switching function, in addition to the role of the wireless power transmitting.

It is to improve characteristics of the antenna that the shielding sheet 220 shields a magnetic field generated by the antenna unit 210 or 310 to prevent an external leakage and condenses the magnetic field in a desired direction.

For this purpose, the shielding sheet 220 may be made of the material having magnetic properties so as to shield the magnetic field and to increase a condensing rate of the magnetic field, when at least one antenna 211, 212, or 213 using a predetermined frequency band transmits and receives the wireless radio signal.

In an exemplary example, the shielding sheet 220 may be a ferrite sheet, a polymer sheet or a ribbon sheet including at least one of an amorphous alloy and a nanocrystalline alloy.

In an exemplary example, the ferrite sheet may be a sintered ferrite sheet, and may include Ni—Zn ferrite or Mn—Zn ferrite. In addition, the ribbon sheet may include an Fe-based or a Co-based magnetic alloy, and the amorphous alloy or the nanocrystal alloy may include a three-element alloy or a five-element alloy. For example, the three-element alloy may include Fe, Si, and B, and the five-element alloy may include Fe, Si, B, Cu, and Nb.

However, it should be noted that the shielding sheet 220 is not limited to the above-described kind, and any material having magnetic properties can be used.

As shown in FIG. 12, the shielding sheet 220' may be provided by stacking a plurality of sheets 225a, through the adhesive layer 225b. In one exemplary embodiment, the plurality of sheets 225a may be the ribbon sheet including at least one of the amorphous alloy and the nanocrystalline alloy.

Meanwhile, the shielding sheet 220 or 220' may be constructed in a divided form into a plurality of fine pieces so as to suppress generation of eddy currents by increasing the overall resistance, and the plurality of fine pieces may be totally or partially insulated from each other. The plurality of pieces may have a size of 1 μm to 3 mm, and each piece may be irregularly randomized.

When the shielding sheet 220' is constructed by stacking the plurality of shielding sheets 123a divided into fine pieces, the adhesive layer 225b disposed between the respective shielding sheets may include a non-conductive component to insulate the fine pieces from each other by infiltrating between fine pieces composing a pair of stacked-sheets. Here, the adhesive layer 225b may be provided as an adhesive agent. Alternatively, the adhesive layer 225b may be provided in a form that the adhesive agent is applied on one or both surfaces of a substrate in form of a film.

In addition, a protective film 224 for protecting the shielding sheet 200 or 220' from the surrounding environment may be applied to at least one of the upper surface and the lower surface of the shielding sheet 200 or 220' via an adhesive layer 223.

Meanwhile, when the antenna unit 210 includes a plurality of antennas 211, 212 or 213 operating different roles, the shielding sheet 220 for the wireless power transmitting module 200 includes a plurality of sheets 221 and 222 to enhance the performance of the corresponding antenna.

For example, when the antenna unit 210 includes the wireless power transmitting antenna 211 and the NFC antenna 213, the shielding sheet 220 may include a first shielding sheet 121 and a second shielding sheet 122 having different characteristics.

More specifically, the first sheet 221 may be disposed in an area corresponding to for the wireless power transmitting antenna 211 to enhance the performance of the wireless power transmitting antenna 211. The second shielding sheet 222 may be disposed on an area corresponding to the NFC antenna 213 to enhance the performance of the NFC antenna 213.

Here, the first shielding sheet 221 may have an area which can fully cover the wireless power transmitting antenna 211, and the second shielding sheet 222 may have an area which can fully cover the NFC antenna 213. In addition, when the MST antenna 212 is disposed outside the wireless power transmitting antenna 211, the first shielding sheet 221 may include, or not include right above area of the MST antenna 212.

Figure 11A:
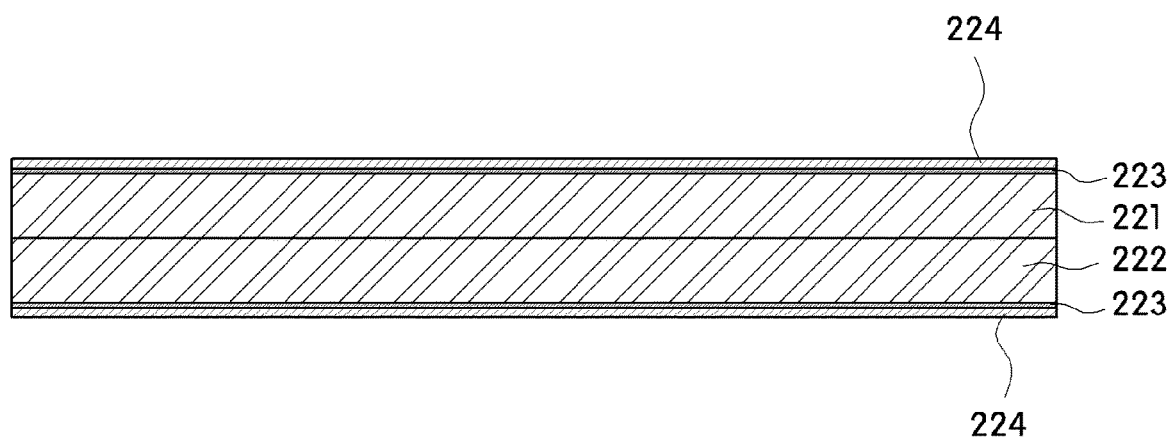
FIGS. 11A to 11C are views showing various forms of shielding units applicable to the wireless power transmitting module, according to exemplary embodiments of the present invention.
Figure 11B:
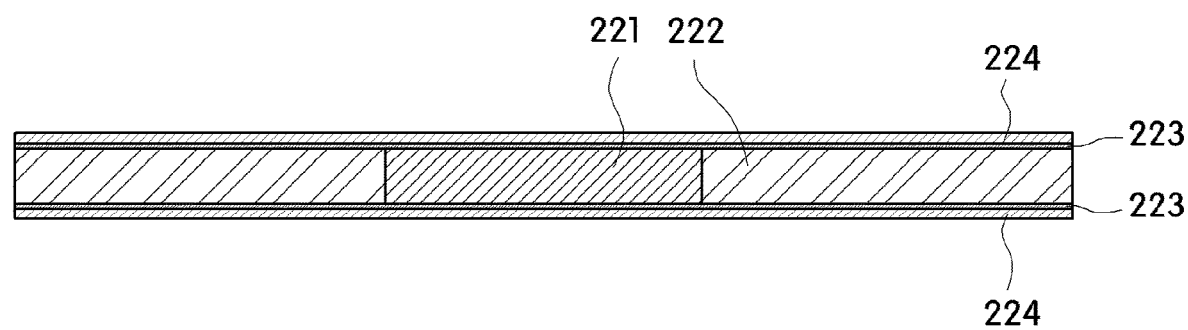
Figure 11C:
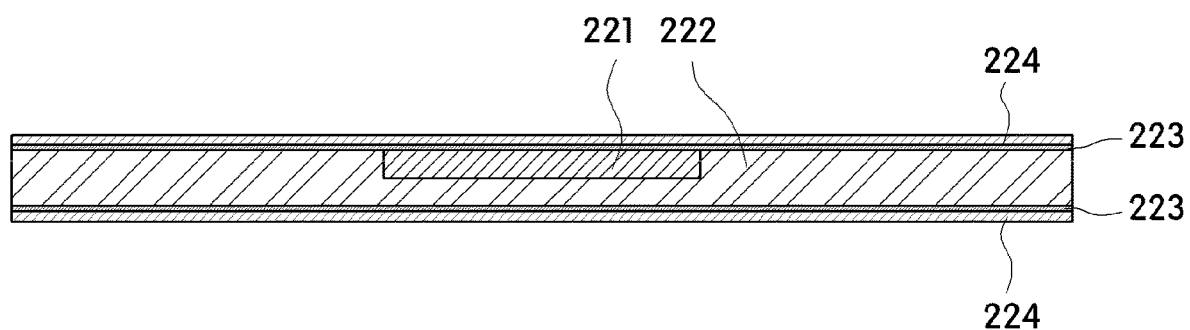
Figure 13:
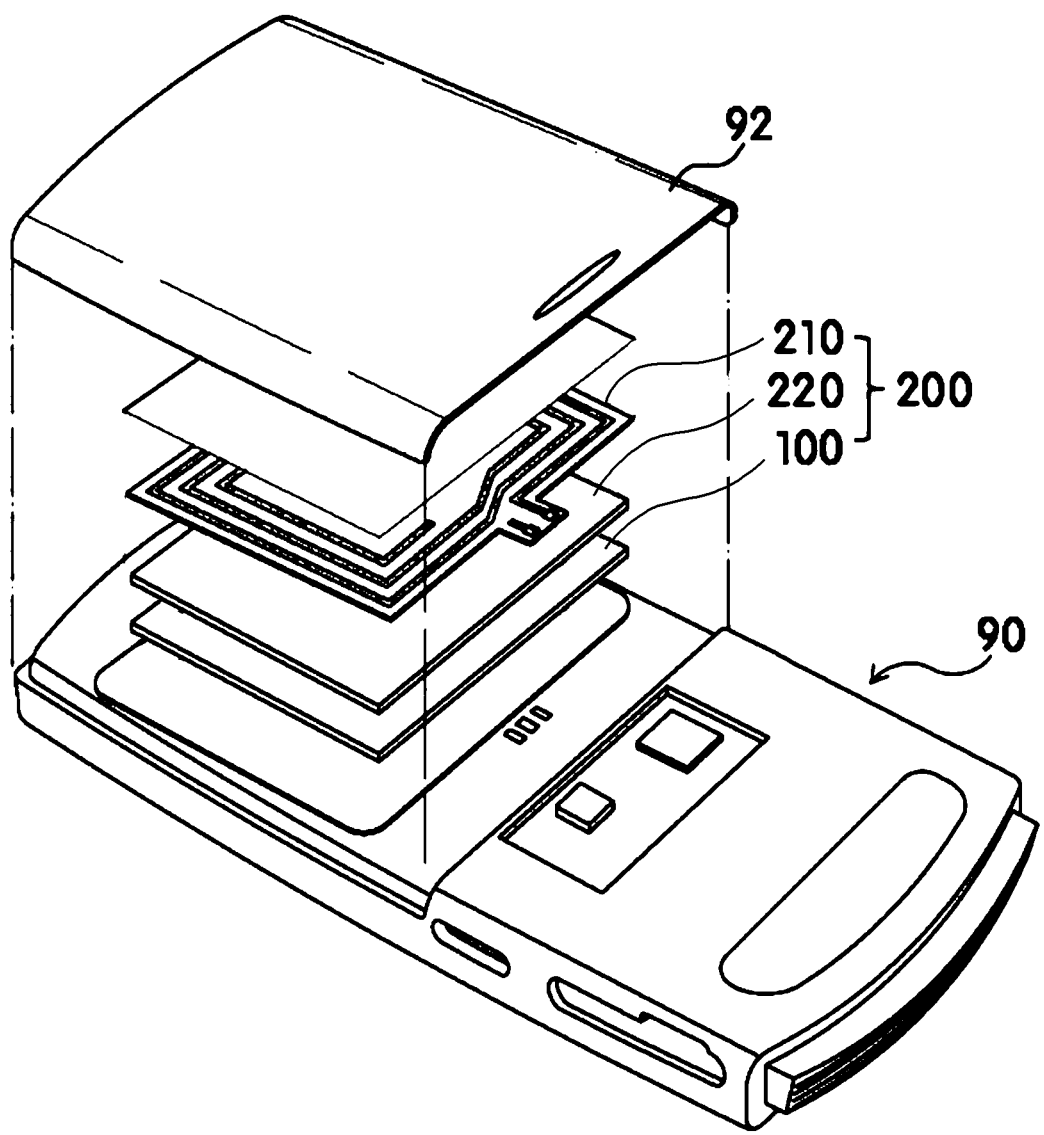
FIG. 13 is a view showing a case where the wireless power transmitting module employing the heat radiating sheet is applied to a mobile phone, according to an exemplary embodiment of the present invention.

In this case, the shielding unit 220 may be provided in a form that the first shielding sheet 221 is stacked on a side of the second shielding sheet 222 (refer to FIG. 11A), or may be provided in a frame type that the first shielding sheet 221 is inserted into and surrounded by the second shielding sheet 222 (refer to FIG. 11B), the first sheet 221 having a thinner thickness than the second sheet 222, may be inserted into one surface of the second sheet 222 (refer to FIG. 11C). In addition, although not shown, the first sheet 221 having a relatively thicker thickness than the second sheet 222 may be inserted into the second sheet 222.

In other words, the first shielding sheet 121 and the second shielding sheet 122 may have different permeabilities in a predetermined frequency band, or may have different saturating magnetic fields. If the first shielding sheet 121 and the second shielding sheet 122 have the same permeability, these two shielding sheets 121 and 122 may have different values of permeability loss rate.

More specifically, the first shielding sheet 221 may have a relatively higher permeability in a low frequency band of 350 kHz or less than that of the second shielding sheet 222, and may have a relatively higher saturating magnetic field in the frequency band of 350 kHz or less than that of the second shielding sheet 222. In a case that the first shielding sheet 221 and the second shielding sheet 222 have the same permeability in the frequency band of 300 kHz or less, the permeability loss rate of the first sheet 221 may have a relatively lower value than that of the second shielding sheet 222.

In an exemplary example, the ribbon sheet including at least one of an amorphous alloy and a nanocrystalline alloy may be used as the first shielding sheet 221. The ferrite sheet may be used as the second sheet 222.

Accordingly, since the ribbon sheet including at least one of an amorphous alloy and a nanocrystalline alloy has a relatively higher magnetic permeability than that of the ferrite sheet in the low frequency band of 350 kHz or less, a time-varying magnetic field generated through the wireless power transmitting in the frequency band of 100 to 300 kHz by a power transmitting device during wireless charging can be attracted by the first shielding sheet 221 having a relatively high permeability. Thus, the wireless power transmitting antenna 211 disposed on the first shielding sheet 221 can receive the wireless power signal with high efficiency.

Meanwhile, when the shielding sheet 220 is provided as a wireless power receiving module and the wireless power transmitting module is provided a permanent magnet, the shielding sheet 220 may be required to shield a time-invariant magnetic field by the permanent magnet provided in wireless power transmitting module. However, since the time-invariant magnetic field has a greater influence on the shielding sheet 220 than the time-varying magnetic field by the antenna unit 210, the time-invariant magnetic field may cause the shielding sheet to be magnetically saturated, thereby drastically lowering the performance of the shielding sheet, or the power transmission efficiency.

Therefore, it is necessary to prevent magnetic saturation by the permanent magnet of the wireless power transmitting module. Since the ribbon sheet including at least one of the amorphous alloy and the nanocrystal alloy has a relatively larger saturation magnetic field than the ferrite sheet in the frequency band of 100 to 300 kHz, the first shielding sheet 221 located on the wireless power transmitting antenna 211 can prevent magnetization by the permanent magnet in the wireless charging frequency band of 100 to 300 kHz, and thus smooth power transmitting can be achieved.

In addition, when the permeability loss rate of the first shielding sheet 221 is lower than that of the second shielding sheet 222 even if the first shielding sheet 221 and the second shielding sheet 222 have the same permeability in the frequency band of 350 kHz, as a result the permeability loss according to the permeability loss rate is reduced when the wireless power is transmitted.

Accordingly, the time-varying magnetic field generated through the power transmission in the frequency band of 100 to 350 kHz by the wireless power transmission module is induced toward the first shielding sheet 221 having a relatively higher permeability. Thus, the wireless power transmitting antenna 211 disposed on the first shielding sheet 221 can receive the wireless power signal with high efficiency.

Meanwhile, the second shielding sheet 222 may have a relatively higher magnetic permeability at a high frequency of 13.56 MHz than that of the first shielding sheet 221. In a case that the first shielding sheet 221 and the second shielding sheet 222 have the same permeability at the frequency of 13.56 MHz, the permeability loss rate of the second shielding sheet 222 may be relatively smaller than the permeability loss rate of the first shielding sheet 221.

In an exemplary example, the ribbon sheet including at least one of an amorphous alloy and a nanocrystalline alloy may be used as the first shielding sheet 221, and the ferrite sheet may be used as the second shielding sheet 222.

Accordingly, the ferrite sheet has a relatively higher magnetic permeability than that of the ribbon sheet including at least one of an amorphous alloy and a nanocrystalline alloy. Thus, in case that NFC is performed, a time-varying magnetic field generated by the high frequency signal of 13.56 MHz generated from an antenna equipped in a radio frequency (RF) reader device is induced toward the second shielding sheet 222 having a relatively high permeability. Thereby, the NFC antenna 116 disposed on the second shielding sheet 222 can receive the high frequency signal with high efficiency.

In addition, when the permeability loss rate of the second shielding sheet 222 is lower than that of the first shielding sheet 221, even if the first shielding sheet 221 and the second shielding sheet 222 have the same permeability in the frequency of 13.56 13.56 MHz, as a result the loss of permeability according to the permeability loss rate is reduced when NFC is performed. Accordingly, the time-varying magnetic field generated by a high frequency signal of 13.56 MHz generated from the antenna equipped in RF reader apparatus is induced toward the second shielding sheet 222 having a relatively high permeability, so that the NFC antenna 213 disposed on the second shielding sheet 222 can receive the high frequency signal with high efficiency.

Here, it has been described above that the ribbon sheet including at least one of an amorphous alloy and a nanocrystal alloy may be used as the first shielding sheet 221, and the ferrite sheet is used as the second shielding sheet 222. However, the present invention is not limited thereto. The material of the first shielding sheet 221 and the second shielding sheet 222 may be variously changed, as long as the permeability, the saturation magnetic field, and the permeability loss rate of the first and second shielding sheets 221 and 222 satisfy the conditions relative to each other in the corresponding frequency band.

In an exemplary embodiment, the first shielding sheet 221 and the second shielding sheet 222 may be made of the same material having different magnetic permeabilities at the frequency of 350 kHz or less and/or at the frequency of 13.56 MHz. The ferrite sheet may be used as the first shielding sheet 221, and the ribbon sheet including at least one of the amorphous alloy and the nanocrystal alloy may be used as the second shielding sheet 222. This is because even if they are made of the same material, they can be manufactured to have different characteristics (e.g., in permeability, saturation magnetic field, permeability loss rate, etc.) through change of several conditions such as a heat treatment temperature, number of stacking layers, etc.

In addition, when the ribbon sheet including at least one of the amorphous alloy and the nanocrystal alloy is used as at least one of the first shieling sheet 221 and the second shielding sheet 222, a single-layer ribbon sheet may be used, or a plurality of ribbon sheets including at least one of the amorphous alloy and the nanocrystal alloy may be used by stacking in layers.

As described above, the present invention has been described with respect to particularly preferred embodiments. However, the present invention is not limited to the above embodiments, and it is possible for one who has an ordinary skill in the art to make various modifications and variations, without departing off the spirit of the present invention.

What is claimed is:

1. A heat radiating sheet comprising:
   a plate-shaped heat radiating member having a predetermined area for radiating heat generated from a heat source; and
   a metallic protecting member, attached to a surface of the heat radiating member via an adhesive layer, for protecting the heat radiating member in addition to for serving as an auxiliary heat radiating member,
   wherein the metallic protecting member is a copper foil or a copper film,
   wherein the adhesive layer includes a thermal conductive component, and
   wherein the metallic protecting member includes a substrate layer made of a metallic material and a coating layer which is radiation-coated on at least one side of the substrate layer.

2. The heat radiating sheet of claim 1, wherein the heat radiating member includes at least one of copper, aluminum and graphite.

3. The heat radiating sheet of claim 1, wherein the metallic protecting member has a thickness of ⅕ to ⅓ of a thickness of the heat radiating member.

4. The heat radiating sheet of claim 1, wherein the metallic protecting member includes at least one slit having a predetermined length.

5. The heat radiating sheet of claim 4, wherein the slit is formed on an area corresponding to a wireless power transmitting antenna disposed on one side of the heat radiating member.

6. The heat radiating sheet of claim 5, wherein the slit is formed in a direction perpendicular to a longitudinal direction of a pattern constituting the wireless power transmitting antenna, or in a direction perpendicular to a tangent of the pattern constituting the wireless power transmitting antenna.

7. The heat radiating sheet of claim 4, wherein the slit is formed in an area other than an area directly above an Application Processor (AP).

* * * * *